(12) United States Patent
Bayraktaroglu et al.

(10) Patent No.: US 6,925,617 B2
(45) Date of Patent: Aug. 2, 2005

(54) METHOD AND APPARATUS FOR GENERATING TEST PATTERN FOR INTEGRATED CIRCUIT DESIGN

(75) Inventors: Ismet Bayraktaroglu, Sunnyvale, CA (US); Olivier Caty, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 61 days.

(21) Appl. No.: 10/349,542

(22) Filed: Jan. 22, 2003

(65) Prior Publication Data

US 2004/0143802 A1 Jul. 22, 2004

(51) Int. Cl.[7] ...................... G06F 17/50; G06F 11/263
(52) U.S. Cl. .......................................... 716/4; 714/738
(58) Field of Search .......................... 716/4–5; 714/724, 714/738

(56) References Cited

U.S. PATENT DOCUMENTS 6,052,809 A * 4/2000 Bowden ..................... 714/738

6,675,337 B1 * 1/2004 Tung et al. ................. 714/733

* cited by examiner

Primary Examiner—Leigh M. Garbowski
(74) Attorney, Agent, or Firm—Gunnison, McKay & Hodgson, L.L.P.

(57) ABSTRACT

A method generates a test pattern for an integrated circuit (IC) design using a functional verification program. The functional verification program includes a stimulus generator, an expected-response generator, and an interface defining ports of the IC design. The method includes (a) converting input ports in the interface into bi-directional in/out ports, (b) supplying stimuli to the converted in/out ports and original in/out ports in the interface by executing the stimulus generator, (c) sampling the stimuli supplied to the converted in/out ports and the original in/out ports, and (d) recording the sampled stimuli. The method may further include (e) creating bi-directional shadow ports in the interface, the shadow ports corresponding to the in/out ports and output ports of the IC design, (f) supplying expected responses to the shadow ports by executing the expected-response generator, (g) sampling the expected responses from the shadow ports, and (h) recording the sampled expected response.

58 Claims, 9 Drawing Sheets

```
ifndef FOR_TESTER interface sys {
input j_clk_0 CLOCK;
output cl_bypass OUTPUT_EDGE OUTPUT_SKEW;
output scan_enable OUTPUT_EDGE OUTPUT_SKEW;
input tdo INPUT_EDGE INPUT_SKEW;
inout [1:0] membist INPUT_EDGE INPUT_SKEW OUTPUT_EDGE OUTPUT_SKEW;
...
}
#else
interface sys {
input j_clk_0 CLOCK;
inout cl_bypass INPUT_EDGE INPUT_SKEW OUTPUT_EDGE OUTPUT_SKEW;
inout scan_enable INPUT_EDGE INPUT_SKEW OUTPUT_EDGE OUTPUT_SKEW;
input tdo INPUT_EDGE INPUT_SKEW;
inout td0_shadow INPUT_EDGE_SHADOW INPUT_SKEW OUTPUT_EDGE_SHADOW OUTPUT_SKEW;
inout [1:0] membist INPUT_EDGE INPUT_SKEW OUTPUT_EDGE OUTPUT_SKEW;
inout [1:0] membist_shadow INPUT_EDGE_SHADOW INPUT_SKEW OUTPUT_EDGE_SHADOW OUTPUT_SKEW;
...
}
#endif
```

```
ifndef FOR_TESTER
  #define COMPARE_MACRO(port, expected, error) if(port != expected) error++;
  #define TESTER_MACRO(port, expected) //no code created
#else
  #define COMPARE_MACRO(port, expected, error) //no code created
  #define TESTER_MACRO(port, expected) port = expected
#endif
```

```
expected_membist = ExpResponseGeneratorForMembist();
COMPARE_MACRO(sys.membist, expected_membist, error);
TESTER_MACRO(sys.membist_shadow, expected_membist);
```

FIG. 9

```
expected_membist = ExpResponseGeneratorForMembist();
if(sys.membist != expected_membist) error++;
```

FIG. 10A

```
expected_membist = ExpResponseGeneratorForMembist();
sys.membist_shadow = expected_membist;
```

FIG. 10B

METHOD AND APPARATUS FOR GENERATING TEST PATTERN FOR INTEGRATED CIRCUIT DESIGN

FIELD OF THE INVENTION

The present invention relates to testing electronic systems. More particularly, the present invention relates to a method and an apparatus for generating test patterns for an integrated circuit (IC) design.

BACKGROUND OF THE INVENTION

To ensure proper operation and high-quality of ICs, manufacturing tests must be run on fabricated devices to detect structural faults and eliminate defective parts or devices. Test patterns for a manufacturing test of an IC design are typically generated using an automatic test pattern generation (ATPG) tool. A conventional test pattern generation requires performing logic simulation of an IC design, typically using a gate-level description of the IC design. The gate-level description of the IC design is typically obtained by logic synthesis of a register-transfer-level (RTL) description of the IC design. An ATPG tool captures input stimuli and output responses during the logic simulation of the IC design and creates test vectors. However, as a circuit design becomes larger and more complex, such logic simulation requires a large number of simulation cycles, and the test pattern generation may take a significantly long time, for example, several days or more.

An IC design is also verified before its physical implementation. A verification of an IC design typically involves a simulation of the IC design. Two types of simulations may be used to verify the IC design: functional simulation and timing simulation. OpenVera™ is an open source hardware verification language (HVL) developed for functional verification of IC hardware designs, originally by Synopsys, Inc. of Mountain View, Calif. OpenVera™ is an object-oriented hardware verification language and enables circuit designers to create reusable objects that can be implemented using high level language and abstract data-structures, rather than low-level, register-transfer-level language (RTL) constructs. OpenVera™ also supports many features of both hardware description language (HDL) such as Verilog and general computer language such as C or C++.

OpenVera-based verification programs run in conjunction with a HDL simulator. OpenVera™ has the capability of separating the interface of an object from its implementation, and OpenVera-based verification programs can be separately compiled and dynamically linked to the HDL simulator. FIG. 1 schematically illustrates conventional verification of an IC design (Design Under Test) 10 using an OpenVera based verification program 20. The IC design 10 is described in a HDL, for example, Verilog (HDL representation). The verification program 20 includes a stimulus generation module (stimulus generator) 22, an expected-response generation module (expected-response generator) 24, and a comparator 26. The stimulus generator 22 operates at a higher level of abstraction, and automatically generates stimuli for the IC design 10 which is simulated by a HDL simulator. The expected-response generator 24 also operates at a higher level of abstraction and typically implements some reference model of the IC design 10 to generate the expected-responses. The comparator 26 compares output signals from the simulated IC design 10 against the expected-responses, and checks if they match. Then the verification program 20 outputs the comparison result (match or mismatch).

As shown in FIG. 1, the IC design 10 has input ports 30, in/out ports 32, and output ports 34. An interface 36 of the verification program provides signal-level connectivity into the HDL representation of the IC design 10, and also defines ports (signal directions) of the IC design 10. Since the functional verification only needs to monitor the output signals from the HDL simulator (simulating the IC design 10), the verification program 20 only samples signals from the in/out ports 32 and from the output ports 34 of the IC design 10.

BRIEF DESCRIPTION OF THE INVENTION

A method generates a test pattern for an integrated circuit (IC) design using a functional verification program capable of verifying the IC design represented in a hardware description language (HDL). The functional verification program includes a stimulus generator, an expected-response generator, and an interface defining ports of the IC design. The method includes (a) converting input ports in the interface into bi-directional in/out ports, the input ports corresponding to input ports of the IC design, (b) supplying stimuli to the converted in/out ports and original in/out ports in the interface by executing the stimulus generator, the original in/out ports corresponding to in/out ports of the IC design, (c) sampling the stimuli supplied to the converted in/out ports and the original in/out ports, and (d) recording the sampled stimuli. The method may further include (e) creating bi-directional shadow ports in the interface, the shadow ports corresponding to the in/out ports and output ports of the IC design, (f) supplying expected responses to the shadow ports by executing the expected-response generator, (g) sampling the expected responses from the shadow ports, and (h) recording the sampled expected response.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 7 is a diagram illustrating an example of the code for converting input ports to in/out ports in accordance with one embodiment of the present invention.

FIG. 8 is a diagram illustrating an example the macro definitions in accordance with one embodiment of present invention.

FIG. 9 is a diagram illustrating an example of the verification code segment using the macros in accordance with one embodiment of present invention.

FIG. 10A is a diagram illustrating an example of the verification code segment for verification.

FIG. 10B is a diagram illustrating an example of the verification code segment for test-pattern generation.

DETAILED DESCRIPTION

Figure 1:
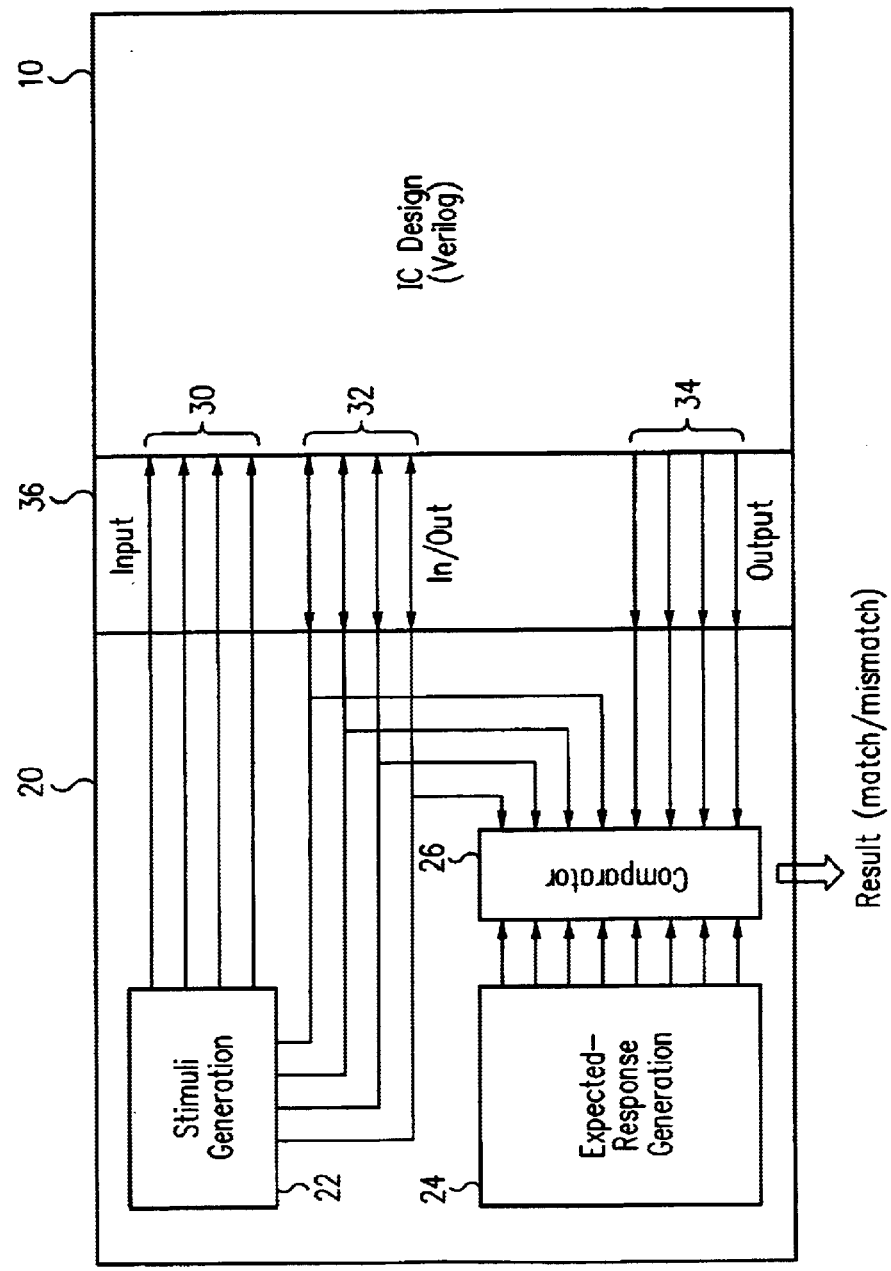
FIG. 1 is a block diagram schematically illustrating a conventional verification scheme for an IC design using an OpenVera based verification program.

Embodiments of the present invention are described herein in the context of a method and apparatus for generating a test pattern for an integrated circuit (IC) design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Washington, or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Figure 2:
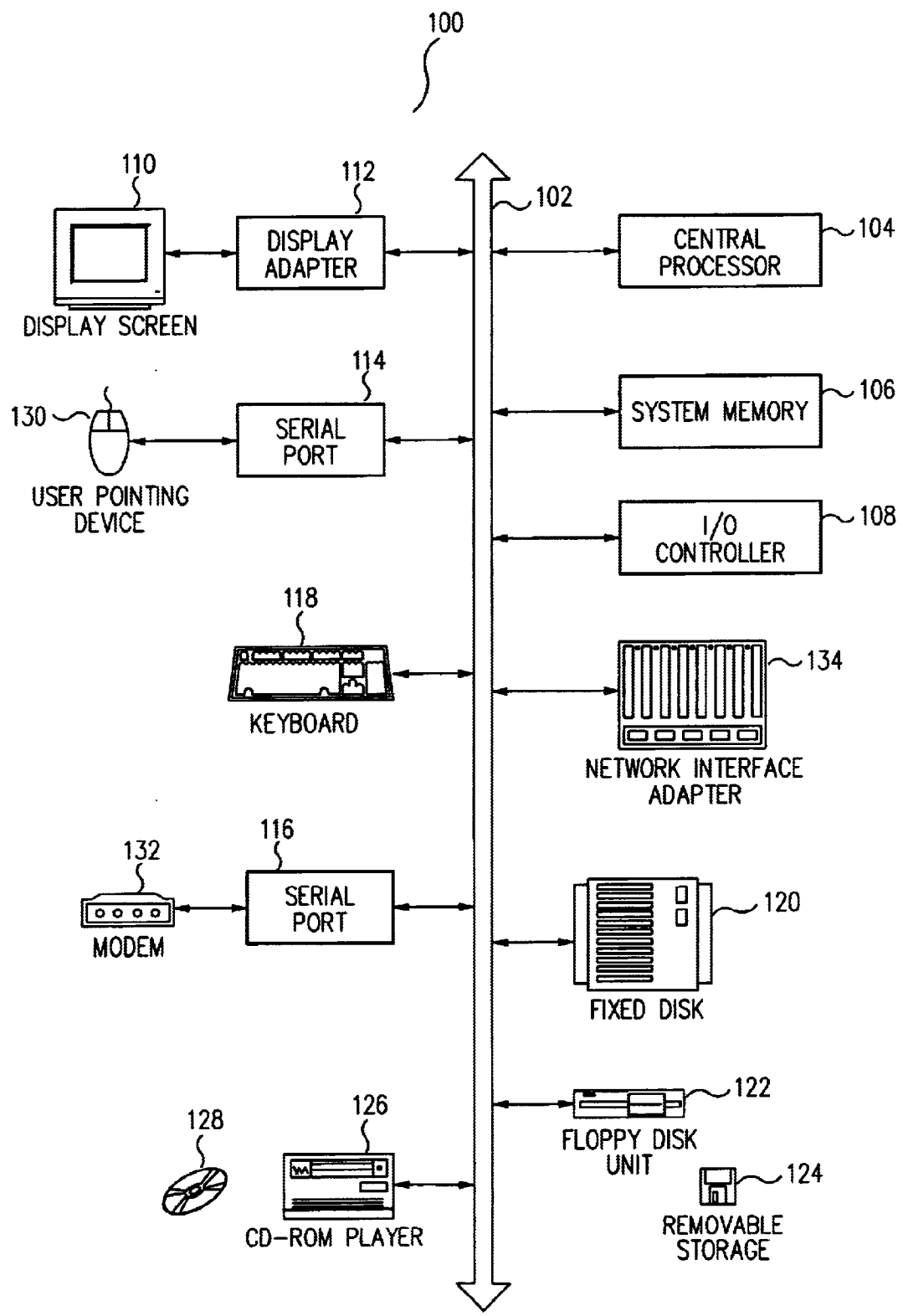
FIG. 2 is a block diagram schematically illustrating a computer system suitable for implementing aspects of the present invention.

FIG. 2 depicts a block diagram of a computer system 100 suitable for implementing aspects of the present invention. As shown in FIG. 2, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalkTM).

Many other devices or subsystems (not shown) may be connected in a similar manner. Also, it is not necessary for all of the devices shown in FIG. 2 to be present to practice the present invention, as discussed below. Furthermore, the devices and subsystems may be interconnected in different ways from that shown in FIG. 2. The operation of a computer system such as that shown in FIG. 2 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

The applicants have realized that when a functional verification program is developed in OpenVera™ for an IC design, the verification program already has information of the input and output signals of the IC design, and thus the functional verification program can be used for test pattern generation. While conventional functional verification programs always run with a HDL simulator, in accordance with one embodiment invention, a verification program is executed stand-alone and the input and output of the IC design are obtained without simulating the IC design to be verified. Although there is a conventional stand-alone logic simulator for generating inputs and outputs of the gate-level description of an IC design, the applicant realized that thee same result can be achieved by utilizing a higher-level or more abstract design without internal logic via an OpenVera-based functional verification program. However, conventional OpenVera-based verification programs do not provide a mechanism to capture the input stimuli and expected responses.

Accordingly, in accordance with one embodiment of the present invention, a mechanism for sampling input stimuli and expected responses generated by a functional verification program is provided. The functional verification program is capable of verifying an IC design represented in a hardware description language (HDL) such as Verilog or VDHL, and includes a stimulus generator, an expected-response generator, and a comparator for comparing expected responses with outputs of the IC design responding to stimuli.

Figure 3:
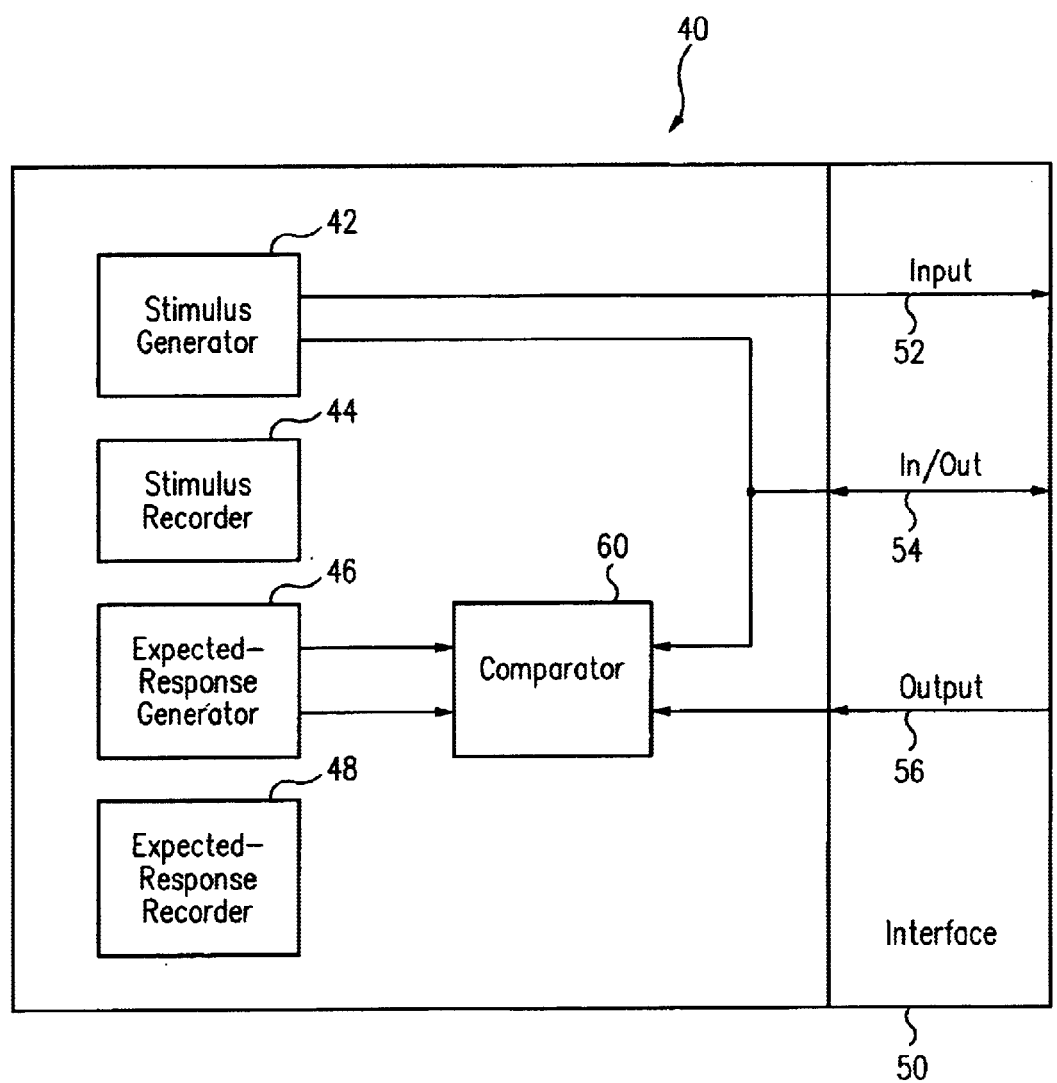
FIG. 3 is a block diagram schematically illustrating a modified functional verification program for test pattern generation in accordance with one embodiment of the present invention.

FIG. 3 schematically illustrates a modified functional verification program 40 for test pattern generation in accordance with one embodiment of the present invention. The modified functional verification program 40 includes a stimulus generator 42, a stimulus recorder 44, an expected response generator 46, an expected response recorder 48, and an interface 50. The interface 50 defines ports of the IC design to be verified. The functional verification program 40 may also include a comparator 60 for comparing expected responses with outputs of the IC design for verification, but the comparator 60 is not used for generating a test pattern. The functional verification program 40 is written in an object-oriented hardware verification language such as OpenVera™. The stimulus recorder 44 and the expected response recorder 48 may be provided as code or modules in the functional verification program 40, and instantiated in a test pattern generation.

FIG. 3 also depicts signals used for an ordinary functional verification process. The interface 50 defines ports of the IC design, i.e., input ports 52, in/out ports 54, and output ports 56 for verification. In the functional verification, these ports are coupled to the corresponding ports of the IC design (simulated by a HDL simulator). During the functional verification, the stimuli generated by the stimulus generator 42 are supplied to input ports 52, and the comparator 60 receives signals from the in/out ports 54 and output ports 56. The comparator 60 also receives the expected responses from the expected response generator 46. The functional verification program 40 performs functional verification in the same manner as a conventional verification program.

Figure 4A:
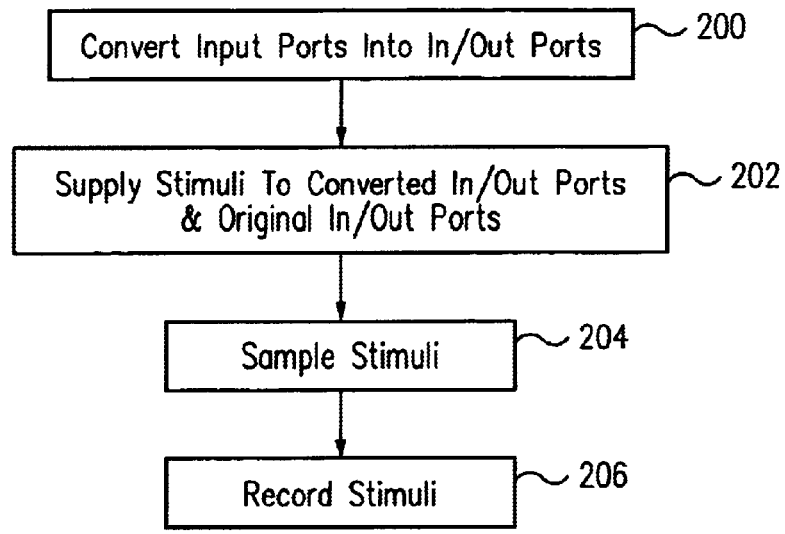
FIG. 4A is a process flow diagram schematically illustrating a method for generating a test pattern for an IC design in accordance with one embodiment of the present invention.
Figure 4B:
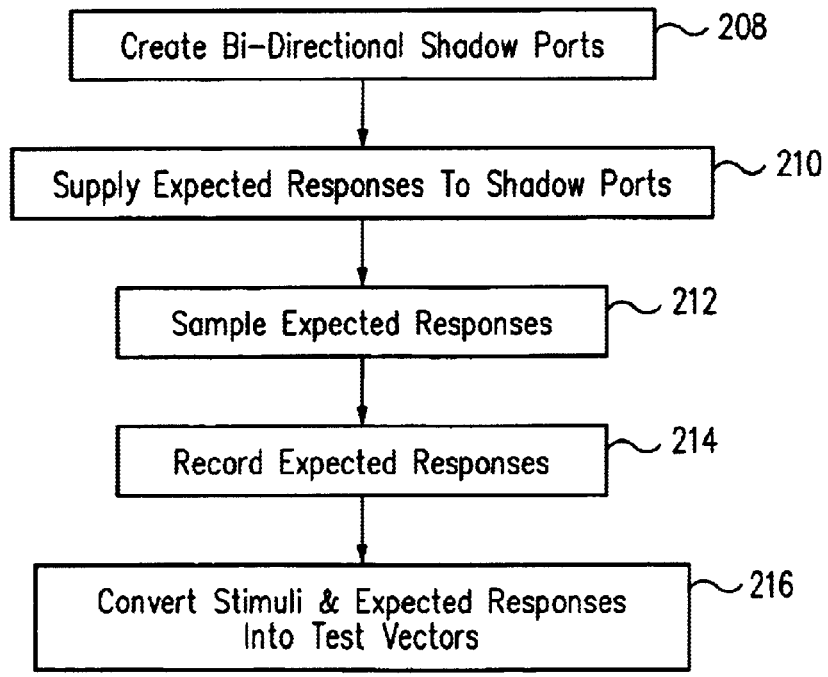
FIG. 4B is a process flow diagram schematically illustrating a method for generating a test pattern for an IC design in accordance with one embodiment of the present invention.
Figure 5:
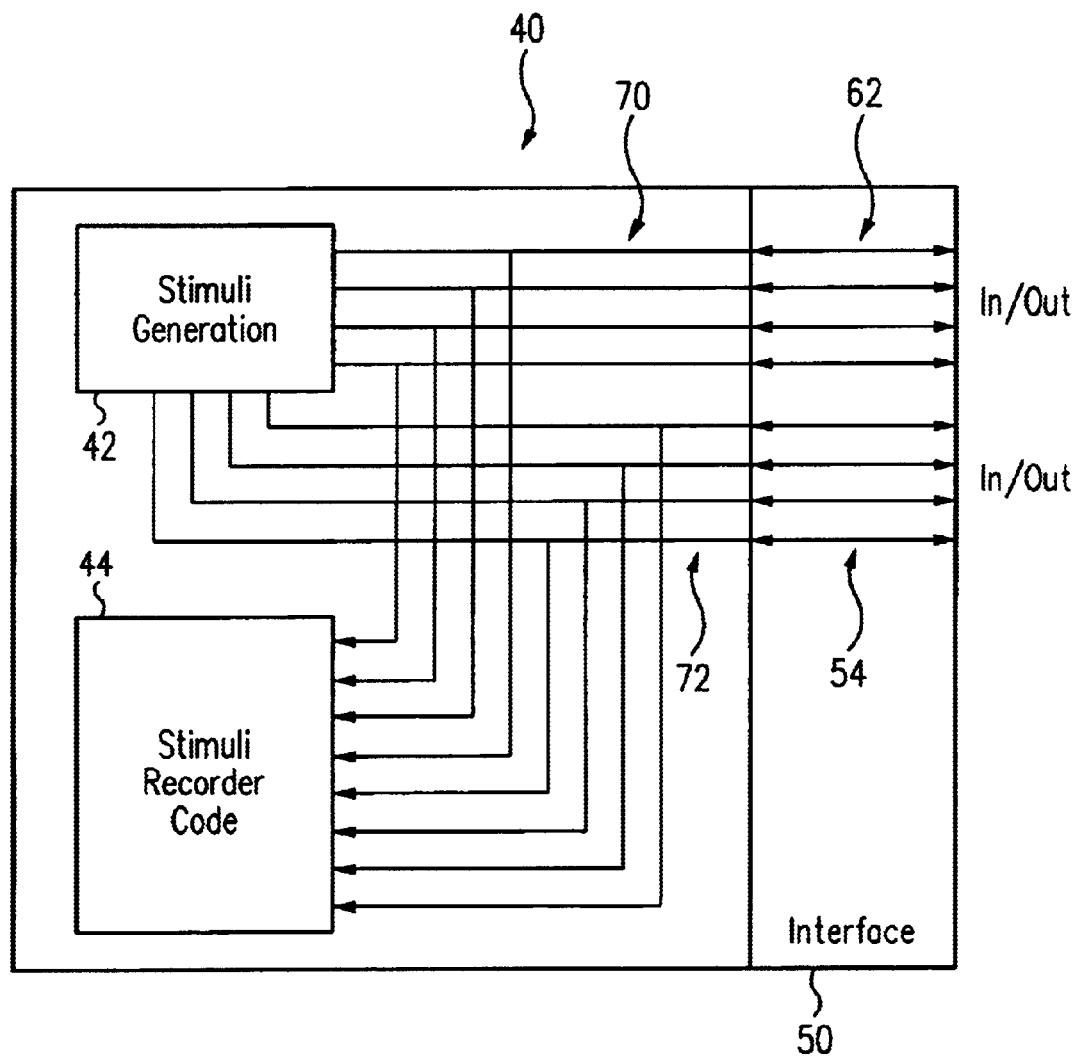
FIG. 5 is a block diagram schematically illustrating the stimuli capturing part of the test pattern generation in accordance with one embodiment of the present invention.

FIGS. 4A and 4B schematically illustrates a method for generating a test pattern for an IC design in accordance with one embodiment of the present invention. Since an OpenVera-based program does not allow sampling signals of unidirectional input-only ports, the input ports 52 (defined in the interface 50 in FIG. 3) corresponding to the input ports of the IC design are converted into bi-directional in/out ports (200), as shown in FIG. 4A. FIG. 5 schematically illustrates the stimuli capturing part of the test pattern generation in accordance with one embodiment of the present invention. As shown in FIG. 5, in test pattern generation, the interface 50 has the converted in/out ports 62 in place of the original input port 52 in FIG. 3. The stimulus generator 42 supplies stimuli to the converted in/out ports 62 and to the original in/out ports 54 (202), as shown in FIGS. 4A and 5. The stimuli supplied to the converted in/out ports 62 and the original in/out ports 54 are sampled (204), and recorded by the stimulus recorder 44 (206) executed concurrently with the stimulus generator 42. Typically, the stimuli are recorded at every clock cycle. It should be noted that the stimuli 70 supplied to the converted in/out port 62 and the stimuli 72 supplied to the original in/out port 54 are now both bi-directional signals and thus can be sampled using the OpenVera based program.

Figure 6:
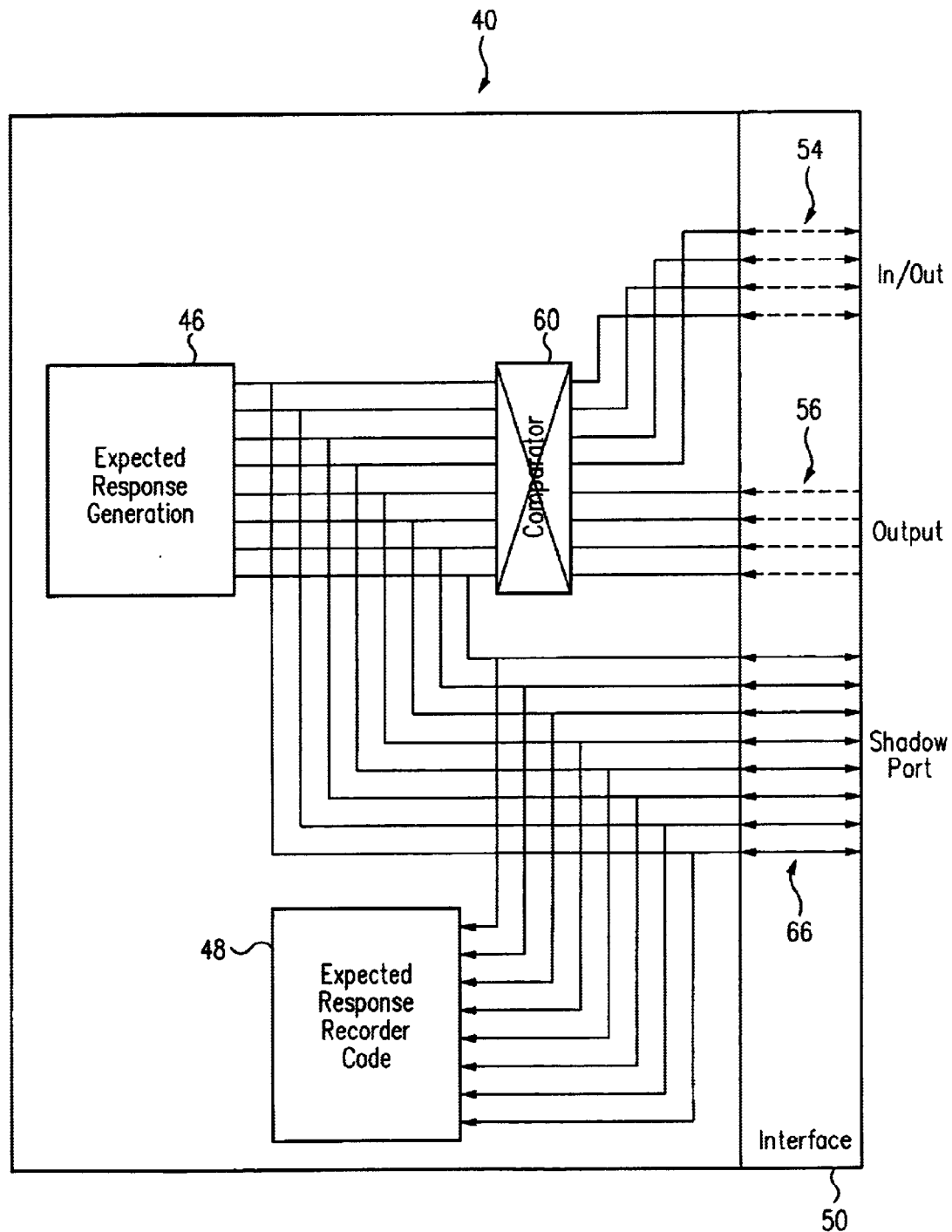
FIG. 6 is a block diagram schematically illustrating the expected response capturing part of the test pattern generation in accordance with one embodiment of the present invention.

FIG. 6 schematically illustrates the expected response capturing part of the test pattern generation in accordance with one embodiment of the present invention. As shown in FIG. 4B, in order to capture the expected responses, bi-directional shadow ports corresponding to the original in/out ports and the original output ports of the IC design are created (208). This is because OpenVera does not provide any explicit mechanism for capturing the values that are compared by the comparator 60 (either expect statements, or if/then/else statements). As shown in FIG. 6, in the pattern generation, the interface 50 further includes the bi-directional shadow ports 66. In order to capture the expected responses, the expected responses are explicitly assigned to the shadow ports 66 instead of the original in/out ports 54 and the output ports 56 of the interface 50.

Referring to FIGS. 4B and 6, the expected responses are supplied to the shadow ports 66 from the expected-response generator 46 (210). Since the shadow ports 66 are bi-directional, the expected responses are sampled from the shadow ports 66 (212), and recorded by the expected-response recorder 48 executed concurrently with the expected-response generator 46 (214). Typically, the responses are recorded at every clock cycle. The recorded stimuli and expected responses may be converted into test vectors for a manufacturing test for the IC design (216). It should be noted that although the stimuli generation/recording and the expected response generation/recording are illustrated separately in FIGS. 4A and 4B, the stimuli generation/recording and the expected response generation/recording are performed concurrently as the functional verification tool 40 is executed.

In accordance with one embodiment of the present invention, the interface 50 is defined by an interface definition code. The original input ports 52 may be converted into the in/out port 62 by providing options in the interface definition code, for example, a first option defining ports for verification and a second option defining ports for test pattern generation. FIG. 7 illustrates an example of the code 100 for converting input ports to in/out ports by providing "if" and "else" statements, in accordance with one embodiment of the present invention. For the functional verification, the interface is defined in accordance with "if" part (#ifndef FOR_TESTER). That is, unless the code for test-pattern generation ("FOR_TESTER") is defined, the interface is defined and compiled for verification purpose as the tool is originally designed. If the code "FOR_TESTER" is defined, the interface is defined and compiled for the test-pattern generation in accordance with "else" part.

It should be noted that a clock signal is also defined in the interface. The signals are sampled in accordance with the clock signal and thus the clock signal does not need a shadow port. It should also be noted that, in this specification, the ports of the interface are referred to using the corresponding ports of the IC design. However, actually, input, output, and in/out ports of the IC design correspond to output, input, and in/out ports of the interface, respectively. Thus, the port names of the example interface code in FIG. 7 do not match that used in the specification. Also, the code is described for illustrative purpose only, and thus the present invention is not limited to specific examples.

The shadow ports 66 may be created in the interface definition if "FOR_TESTER" option is provided. The expected responses are assigned to the shadow ports 66 in accordance with the options. For example, by defining macros for assigning the expected responses to the shadow ports, and using them in the verification code, the assignment to the shadow ports can be done without further hanging the verification code. Macro definitions are simple preprocessing functions and are evaluated by a preprocessor (compiler).

FIG. 8 illustrates an example of such macro definitions 102. The macros are defined together with the interface definition for each option (#if and #else). As shown in FIG. 8, two macros are defined: "COMPARE_MACRO" and "TESTER_MACRO." The COMPARE_MACRO performs comparison between the expected responses and outputs from the IC design if the first option (#ifndef FOR_TESTER) is selected (i.e., if "FOR_TESTER" is not defined). The TESTER_MACRO creates no code in this option. If the second option (#else) is selected, i.e., FOR_TESTER is defined, the TESTER_MACRO assigns the expected responses to the shadow ports, while the COMPARE_MACRO does not create code in the second option. FIG. 9 illustrates a verification code segment 104 using the macros.

The interface definition code may be compiled, for example, using a preprocessor (compiler), in accordance with the second option for test pattern generation, and in accordance with the first option for functional verification. The macros are also preprocessed in accordance with the options, and perform a text replacement of their arguments with no interruption. When the macros are preprocessed (i.e., defined) in accordance with the first option (#ifndef FOR_TESTER), the verification code segment 104 (FIG. 9) is the same as a code segment 106 for verification, as shown in FIG. 10A, which compares the output from the IC design with the expected responses. No shadow port assignment occurs in this option. When the macros are preprocessed (i.e., defined) in accordance with the second option (#else), the verification code segment 104 (FIG. 9) is the same as a code segment 108, as shown in FIG. 10B, which assigns the expected responses to the shadow ports.

As described above, in accordance with the embodiments of the present invention, test patterns are generated from an OpenVera-based functional verification program developed for an IC design without performing any logic simulation of the IC design to be verified. This dramatically reduces the time required for test pattern generation, for example, from hours to minutes.

For test pattern generation purpose, input pins of the IC design (i.e., input ports defined in the interface) are converted into in/out pins (in/out ports) in order to capture input signals (stimuli), and the input signals are sampled at every clock cycle. The input signals to the original in/out ports can directly be sampled without any additional modification. In order to capture responses (expected output signals of the IC design), shadow ports are defined for each of the original in/out ports and output ports (and for port variable) in the interface definition. The expected responses are assigned to the shadow ports for test-pattern generation purpose. Since the shadow ports are defined as bi-directional in/out ports, a concurrently running task, i.e., the expected-response recorder, can sample the values of the shadow ports to capture the expected responses.

In addition, since the port conversion and creation of the shadow ports are implemented using the interface definition code, which is compiled into according to the provided options for verification and for test pattern generation, the functional verification code does not need to be modified. The assignment to the shadow ports is also done without changing the verification code by using macros within the verification code, which are preprocessed (and defined) in accordance with the options.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for generating information usable in a test pattern for an integrated circuit (IC) design using a functional verification program including a stimulus generator, an expected-response generator, and an interface defining ports of the IC design, said method comprising:

converting input ports in the interface into bi-directional in/out ports, the input ports corresponding to input ports of the IC design;

supplying stimuli to the converted in/out ports and original in/out ports in the interface by executing the stimulus generator, the original in/out ports corresponding to in/out ports of the IC design;

sampling the stimuli supplied to the converted in/out ports and the original in/out ports; and recording the sampled stimuli.

2. A method in accordance with claim 1, further comprising:

converting the recorded stimuli into test vectors for a manufacturing test for the IC design.

3. A method in accordance with claim 1 wherein said converting includes:

providing options in an interface definition code, the options including a first option defining ports for verification and a second option defining ports for test pattern generation.

4. A method in accordance with claim 3 wherein said converting further includes:

compiling the interface definition code in accordance with the second option.

5. A method in accordance with claim 1 wherein said sampling includes:

executing a stimuli recorder module concurrently with the stimulus generator.

6. A method in accordance with claim 5 wherein the stimuli recorder module samples and records the stimuli at every clock cycle.

7. A method in accordance with claim 1, further comprising:

creating bi-directional shadow ports in the interface, the shadow ports corresponding to the in/out ports and output ports of the IC design;

supplying expected responses to the shadow ports by executing the expected-response generator;

sampling the expected responses from the shadow ports; and recording the sampled expected responses.

8. A method in accordance with claim 7, further comprising:

converting the recorded expected responses into test vectors for a manufacturing test for the IC design.

9. A method in accordance with claim 7 wherein said creating includes:

providing options in an interface definition code, the options including a first option defining ports for verification and a second option defining ports for test pattern generation.

10. A method in accordance with claim 9, further comprising:

assigning the expected responses to the shadow ports in accordance with the options.

11. A method in accordance with claim 10 wherein said assigning includes:

defining macros for assigning the expected responses to the shadow ports in accordance with the options, the macros being used in verification code of the functional verification program.

12. A method in accordance with claim 11 wherein the macros include:

a first macro for performing comparison between the expected responses and outputs from the IC design wherein said first macro is used when said first option is selected in said interface definition code; and a second macro for assigning the expected responses to the shadow ports wherein said second macro is used when said second option is selected in said interface definition code.

13. A method in accordance with claim 10 wherein said creating further includes:

compiling the interface definition code in accordance with the second option.

14. A method in accordance with claim 9 wherein said sampling the expected responses includes:

executing a expected-response recorder module concurrently with the expected-response generator.

15. A method in accordance with claim 14 wherein the expected-response recorder module samples and records the expected responses at every clock cycle.

16. A method in accordance with claim 1 wherein said method is performed without performing a logic simulation of the IC design.

17. A method in accordance with claim 1 wherein the functional verification program is written in an object-oriented hardware verification language.

18. A method for generating information usable in a test pattern for an integrated circuit (IC) design using a functional verification program including a stimulus generator, an expected-response generator, and an interface defining ports of the IC design, said method comprising:

converting input ports in the interface into bi-directional in/out ports, the input ports corresponding to input ports of the IC design;

creating bi-directional shadow ports in the interface, the shadow ports corresponding to in/out ports and output ports of the IC design;

supplying stimuli to the converted in/out ports and original in/out ports in the interface by executing the original in/out ports 54 and the output ports 56 of the interface 50.

sampling the stimuli supplied to the converted input ports and the original in/out ports;

recording the sampled stimuli;

supplying expected responses to the shadow ports by executing the expected-response generator;

sampling the expected responses from the shadow ports; and recording the sampled expected responses.

19. A method in accordance with claim 18, further comprising:

converting the recorded stimuli and expected responses into input test vectors for a manufacturing test for the IC design.

20. A method in accordance with claim 18 wherein said converting and creating include:

providing options in an interface definition code, the options including a first option defining ports for verification and a second option defining ports for test pattern generation.

21. A method in accordance with claim 20, further comprising:

assigning the expected responses to the shadow ports in accordance with the options.

22. A method in accordance with claim 21 wherein said assigning includes:

defining macros for assigning the expected responses to the shadow ports in accordance with the options, the macros being used in verification code of the functional verification program.

23. A method in accordance with claim 22 wherein the macros include:

a first macro for performing comparison between the expected responses and outputs from the IC design wherein said first macro is used when said first option is selected in said interface definition code; and a second macro for assigning the expected responses to the shadow ports wherein said second macro is used when said second option is selected in said interface definition code.

24. A method in accordance with claim 21 wherein said converting and creating further include:

compiling the interface definition code in accordance with the second option.

25. A method in accordance with claim 18 wherein said sampling the stimuli includes:

executing a stimuli recorder module concurrently with the stimulus generator; and wherein said sampling the expected responses includes:

executing a expected-response recorder module concurrently with the expected-response generator.

26. A method in accordance with claim 25 wherein the stimuli recorder samples and records the stimuli at every clock cycle, and the expected-response recorder samples and records the expected response at every clock cycle.

27. A method in accordance with claim 18 wherein said method is performed without performing a logic simulation of the IC design.

28. A method in accordance with claim 18 wherein the functional verification program is written in an object-oriented hardware verification language.

29. An apparatus for generating information usable in a test pattern for an integrated circuit (IC) design using a functional verification program including a stimulus generator, an expected-response generator, and an interface defining ports of the IC design, said apparatus comprising:

means for converting input ports in the interface into bi-directional in/out ports, the input ports corresponding to input ports of the IC design;

means for supplying stimuli to the converted in/out ports and original in/out ports in the interface by executing the stimulus generator, the original in/out ports corresponding to in/out ports of the IC design;

means for sampling the stimuli supplied to the converted in/out ports and the original in/out ports; and means for recording the sampled stimuli.

30. An apparatus in accordance with claim 29, further comprising:

means for converting the recorded stimuli into test vectors for a manufacturing test for the IC design.

31. An apparatus in accordance with claim 29 wherein said means for converting includes:

means for providing options in an interface definition code, the options including a first option option defining ports for verification and a second option defining ports for test pattern generation.

32. An apparatus in accordance with claim 31 wherein said means for converting further includes:

means for compiling the interface definition code in accordance with the second option.

33. An apparatus in accordance with claim 29 wherein said means for sampling includes:

means for executing a stimuli recorder module concurrently with the stimulus generator.

34. An apparatus in accordance with claim 33 wherein the stimuli recorder module samples and records the stimuli at every clock cycle.

35. An apparatus in accordance with claim 29, further comprising:
   means for creating bi-directional shadow ports in the interface, the shadow ports corresponding to the in/out ports and output ports of the IC design;
   means for supplying expected responses to the shadow ports by executing the expected-response generator;
   means for sampling the expected responses from the shadow ports; and
   means for recording the sampled expected responses.

36. An apparatus in accordance with claim 35, further comprising:
   means for converting the recorded expected responses into test vectors for a manufacturing test for the IC design.

37. An apparatus in accordance with claim 35 wherein said means for creating includes:
   means for providing options in an interface definition code, the options including a first option defining ports for verification and a second option defining ports for test pattern generation.

38. An apparatus in accordance with claim 37, further comprising:
   means for assigning the expected responses to the shadow ports in accordance with the options.

39. An apparatus in accordance with claim 38 wherein said means for assigning includes:
   means for defining macros for assigning the expected responses to the shadow ports in accordance with the options, the macros being used in verification code of the functional verification program.

40. An apparatus in accordance with claim 39 wherein the macros include:
   a first macro for performing comparison between the expected responses and outputs from the IC design wherein said first macro is used when said first option is selected in said interface definition code; and
   a second macro for assigning the expected responses to the shadow ports wherein said second macro is used when said second option is selected in said interface definition code.

41. An apparatus in accordance with claim 38 wherein said means for creating further includes:
   means for compiling the interface definition code in accordance with the second option.

42. An apparatus in accordance with claim 37 wherein said means for sampling the expected responses includes:
   means for executing a expected-response recorder module concurrently with the expected-response generator.

43. An apparatus in accordance with claim 42 wherein the expected-response recorder module samples and records the expected responses at every clock cycle.

44. An apparatus in accordance with claim 29 wherein said apparatus operates without performing a logic simulation of simulating the IC design.

45. An apparatus in accordance with claim 29 wherein the functional verification program is written in an object-oriented hardware verification language.

46. An apparatus for generating information usable in a test pattern for an integrated circuit (IC) design using a functional verification program including a stimulus generator, an expected-response generator, and an interface defining ports of the IC design, said apparatus comprising:
   means for converting input ports in the interface into bi-directional in/out ports, the input ports corresponding to input ports of the IC design;
   means for creating bi-directional shadow ports in the interface, the shadow ports corresponding to in/out ports and output ports of the IC design;
   means for supplying stimuli to the converted in/out ports and original in/out ports in the interface by executing the stimulus generator, the original in/out ports corresponding to the in/out ports of the IC design;
   means for sampling the stimuli supplied to the converted input ports and the original in/out ports;
   means for recording the sampled stimuli;
   means for supplying expected responses to the shadow ports by executing the expected-response generator;
   means for sampling the expected responses from the shadow ports; and
   means for recording the sampled expected responses.

47. An apparatus in accordance with claim 46, further comprising:
   means for converting the recorded stimuli and expected responses into input test vectors for a manufacturing test for the IC design.

48. An apparatus in accordance with claim 46, further comprising:
   means for providing options in an interface definition code, the options including a first option defining ports for verification and a second option defining ports for test pattern generation.

49. An apparatus in accordance with claim 48, further comprising:
   means for assigning the expected responses to the shadow ports in accordance with the options.

50. An apparatus in accordance with claim 49 wherein said means for assigning includes:
   means for defining macros for assigning the original in/out ports and the output ports of the IC design to the shadow ports in accordance with the options, the macros being used in verification code of the functional verification program.

51. An apparatus in accordance with claim 50 wherein the macros include:
   a first macro for performing comparison between the expected responses and outputs from the IC design wherein said first macro is used when said first option is selected in said interface definition code; and
   a second macro for assigning the expected responses to the shadow ports wherein said second macro is used when said second option is selected in said interface definition code.

52. An apparatus in accordance with claim 49, further comprising:
   means for compiling the interface definition code in accordance with the second option.

53. An apparatus in accordance with claim 46 wherein said means for sampling the stimuli includes:
   means for executing a stimuli recorder module concurrently with the stimulus generator; and wherein said means for sampling the expected responses includes:
   means for executing a expected-response recorder module concurrently with the expected-response generator.

54. An apparatus in accordance with claim 53 wherein the stimuli recorder samples and records the stimuli at every clock cycle, and the expected-response recorder samples and records the expected response at every clock cycle.

55. An apparatus in accordance with claim 46 wherein said apparatus operates without performing a logic simulation of the IC design.

56. An apparatus in accordance with claim 46 wherein the functional verification program is written in an object-oriented hardware verification language.

57. A program storage device readable by a machine, tangibly embodying a program of instructions executable by the machine to perform a method for generating information usable in a test pattern for an integrated circuit (IC) design using a functional verification program including a stimulus generator, an expected-response generator, and an interface defining ports of the IC design, said method comprising:

converting input ports in the interface into bi-directional in/out ports, the input ports corresponding to input ports of the IC design;

supplying stimuli to the converted in/out ports and original in/out ports in the interface by executing the stimulus generator, the original in/out ports corresponding to in/out ports of the IC design;

sampling the stimuli supplied to the converted in/out ports and the original in/out ports; and recording the sampled stimuli.

58. A program storage device in accordance with claim 57 wherein said method further comprising:

creating bi-directional shadow ports in the interface, the shadow ports corresponding to the in/out ports and output ports of the IC design;

supplying expected responses to the shadow ports by executing the expected-response generator;

sampling the expected responses from the shadow ports; and recording the sampled expected responses.

* * * * *